(12) United States Patent
Clink et al.

(10) Patent No.: US 7,057,115 B2
(45) Date of Patent: Jun. 6, 2006

(54) MULTILAYERED CIRCUIT BOARD FOR HIGH-SPEED, DIFFERENTIAL SIGNALS

(75) Inventors: James Clink, Reigate (GB); John E. Benham, Torrington, CT (US); John Mitchell, Los Altos, CA (US)

(73) Assignee: Litton Systems, Inc., Los Angeles, CA (US)

( * ) Notice: Subject to any disclaimer, the term of this patent is extended or adjusted under 35 U.S.C. 154(b) by 11 days.

(21) Appl. No.: 10/876,569

(22) Filed: Jun. 28, 2004

(65) Prior Publication Data

US 2005/0161254 A1 Jul. 28, 2005

Related U.S. Application Data

(60) Provisional application No. 60/539,397, filed on Jan. 28, 2004, provisional application No. 60/539,105, filed on Jan. 27, 2004, provisional application No. 60/538,476, filed on Jan. 26, 2004.

(51) Int. Cl.
*H05K 1/03* (2006.01)

(52) U.S. Cl. .................. 174/255; 174/261; 174/262; 361/780; 361/794; 361/760; 361/803; 361/777

(58) Field of Classification Search ............... 174/255, 174/36, 262, 261, 266; 361/792–795, 777, 361/780, 767–768
See application file for complete search history.

(56) References Cited

U.S. PATENT DOCUMENTS

| 4,829,404 | A | * | 5/1989 | Jensen ..................... 361/749 |
|---|---|---|---|---|
| 5,046,966 | A | | 9/1991 | Snyder et al. |
| 5,331,514 | A | * | 7/1994 | Kuroda ..................... 361/760 |
| 5,557,502 | A | | 9/1996 | Banerjee et al. |
| 5,726,860 | A | * | 3/1998 | Mozdzen .................. 361/761 |
| 5,784,262 | A | * | 7/1998 | Sherman .................. 361/777 |
| 5,812,378 | A | * | 9/1998 | Fjelstad et al. ............ 361/769 |
| 5,815,374 | A | | 9/1998 | Howell |

(Continued)

FOREIGN PATENT DOCUMENTS

EP 1 330 145 A2 7/2003

(Continued)

OTHER PUBLICATIONS

Differential Signals The Differential Difference by Douglas Brooks; a CMP publication, May, 2001; http://www.ultracad.com.*

*Primary Examiner*—Randy W. Gidson
*Assistant Examiner*—Hoa C. Nguyen
(74) *Attorney, Agent, or Firm*—Rothwell, Figg, Ernst & Manbeck

(57) ABSTRACT

The present invention provides a circuit board having a differential signal pad pair consisting of a first signal pad and a second signal pad. The first signal pad has (i) a signal via extending therethrough for electrically connecting the first signal pad to a first transmission line of a differential signal path located within the circuit board and (ii) a contact section for receiving a first contact element of a connector. The second signal pad has (i) a signal via extending therethrough for electrically connecting the second signal pad to a second transmission line of the differential signal path and (ii) a contact section for receiving a second contact element of the connector. The distance between the signal via in the first signal pad and the signal via in the second signal pad is greater than the distance between the contact section of the first signal pad and contact section of the second signal pad.

26 Claims, 9 Drawing Sheets

U.S. PATENT DOCUMENTS

| | | | |
|---|---|---|---|
| 5,966,293 A | 10/1999 | Obermaier et al. | |
| 6,121,554 A * | 9/2000 | Kamikawa | 174/260 |
| 6,232,564 B1 * | 5/2001 | Arndt et al. | 174/266 |
| 6,235,997 B1 * | 5/2001 | Asada et al. | 174/260 |
| 6,384,341 B1 * | 5/2002 | Rothermel et al. | 174/255 |
| 6,423,909 B1 * | 7/2002 | Haynie et al. | 174/261 |
| 6,528,737 B1 * | 3/2003 | Kwong et al. | 174/262 |
| 6,537,087 B1 * | 3/2003 | McNamara et al. | 439/108 |
| 6,717,825 B1 * | 4/2004 | Volstorf | 361/803 |
| 6,815,621 B1 * | 11/2004 | Park et al. | 174/260 |
| 2002/0185302 A1 * | 12/2002 | Henson | 174/255 |
| 2003/0102151 A1 * | 6/2003 | Hirose et al. | 174/250 |
| 2004/0188135 A1 * | 9/2004 | Brodsky et al. | 174/255 |
| 2005/0063166 A1 * | 3/2005 | Boggs et al. | 361/780 |

FOREIGN PATENT DOCUMENTS

| | | |
|---|---|---|
| JP | 11-317471 A | 11/1999 |

* cited by examiner

MULTILAYERED CIRCUIT BOARD FOR HIGH-SPEED, DIFFERENTIAL SIGNALS

This application claims the benefit of U.S. Provisional Patent Application Nos. 60/539,397; 60/539,105 and 60/538,476, filed on Jan. 28, 2004, Jan. 27, 2004, and Jan. 26, 2004, respectively. The above identified provisional patent applications are incorporated herein by this reference.

BACKGROUND OF THE INVENTION

1. Field of the Invention

The present invention relates to circuit boards, and, more specifically, to circuit boards for use in high-speed data applications.

2. Discussion of the Background

In recent years, accompanying the improvement in function, performance and speed of electronic equipment, there has been an increasing demand for, among other things, circuit boards capable of high-speed data transmission with a high-density of data paths.

SUMMARY OF THE INVENTION

The present invention provides a multilayered circuit board that can be used in, among other things, high-density and high-speed electronic applications.

In one aspect, a circuit board according to an embodiment of the present invention includes: a differential signal pad pair having a first signal pad and a second signal pad and a ground plane surrounding but electrically isolated from the both the first and second signal pad, thereby electrically isolating the first signal pad from the second signal pad. Preferably, the first signal pad has (i) a signal via extending therethrough and electrically connecting the first signal pad to a first transmission line of a differential signal path located within the circuit board and (ii) a contact section for receiving a first contact element of a connector. Preferably, the signal via is positioned near an end of the first signal pad and spaced apart from the center of the pad. Similarly, the second signal pad has (i) a signal via extending therethrough and electrically connecting the second signal pad to a second transmission line of the differential signal path and (ii) a contact section for receiving a second contact element of the connector. Preferably, the signal via is positioned near an end of the second signal pad and spaced apart from the center of the pad. Advantageously, in some embodiments, the distance between the center of the signal via in the first signal pad and the center of the signal via in the second signal pad is greater than the distance between the center of the contact portion of the of the first signal pad and the center of the contact portion of the second signal pad.

In another aspect, a circuit board according to an embodiment of the present invention includes: six pairs of signal vias, wherein the first signal via and second signal via of the first pair and the first signal via and second signal via of the second pair are aligned along a first line; the first signal via and second signal via of the third pair and the first signal via and second signal via of the fourth pair are aligned along a second line that is parallel with and spaced apart from the first line; the second signal via of the first pair, the first signal via of the fifth pair, and the first signal via of the sixth pair are aligned along a third line that is not parallel with the first and second lines; and the first signal via of the second pair, the second signal via of the fifth pair, and the second signal via of the sixth pair are aligned along a fourth line that is parallel with the third line.

Advantageously, the first pair is connected to the third pair by a first differential transmission path having a first transmission line and a second transmission line, the second pair is connected to the fourth pair by a second differential transmission path having a first transmission line and a second transmission line, and the fifth pair is connected to the sixth pair by a third differential transmission path having a first transmission line and a second transmission line.

Preferably, each of said transmission lines comprises a first end section, a second end section and an interim section between the first and second end sections, with each interim section being straight and parallel with the other interim sections and, for each transmission line, the first end section and the second end section is angled with respect to the interim section and the interim section is substantially longer than the end sections.

The above and other features and advantages of the present invention, as well as the structure and operation of preferred embodiments of the present invention, are described in detail below with reference to the accompanying drawings.

BRIEF DESCRIPTION OF THE DRAWINGS

The accompanying drawings, which are incorporated herein and form part of the specification, help illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENT

The present invention provides a multilayered circuit board for use in high-speed data applications.

Figure 1:
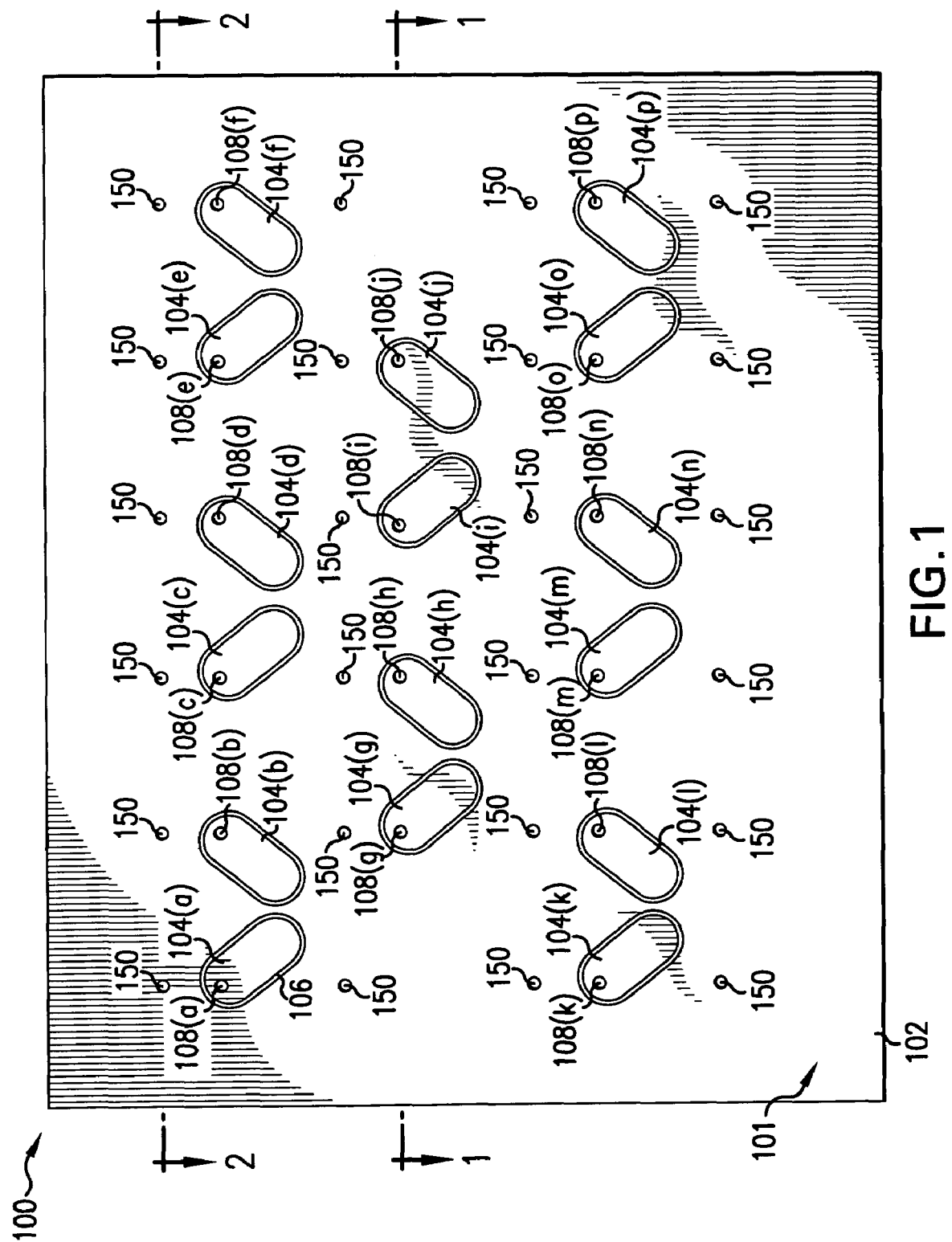
FIG. 1 is a top view of a portion of a multilayered circuit board 100 according to an embodiment of the present invention.

FIG. 1 is a top view of a portion of a multilayered circuit board 100 according to an embodiment of the present invention. As shown in FIG. 1, top layer 101 (see FIG. 2) of circuit board 100 includes a ground plane 102, which is made of an electrically conducting material (e.g., copper), and a set of signal pads 104(a)–(p). Because circuit board 100 is intended to be used for transmitting differential signals, each signal pad 104 is paired with another signal pad 104 to form a differential signal pad pair.

For example, a first differential signal pad pair is formed by signal pads 104*a* and 104*b*, a second pair of signal pads is formed by signal pads 104*c* and 104*d*, a third pair of signal pads is formed by signal pads 104*e* and 104*f*, a fourth pair of signal pads is formed by signal pads 104*g* and 104*h*, a fifth pair of signal pads is formed by signal pads 104*i* and 104*j*, a sixth pair of signal pads is formed by signal pads 104*k* and 104*l*, a seventh pair of signal pads is formed by signal pads 104*m* and 104*n*, and an eighth pair of signal pads is formed by signal pads 104*o* and 104*p*.

Each signal pad 104 is surrounded by and electrically isolated from the ground plane 102. For example, a clear cut or anti-pad 106 (or other dielectric substance) surrounds each signal pad 104, thereby electrically isolating the signal pad 104 from the surrounding ground plane 102. Because each signal pad 104 is surrounded by ground plane 102, each signal pad 104 is also electrically isolated from the other signal pads 104. In some embodiments, signal pads 104 may be plated with nickel and gold.

Preferably, signal pads 104 are elongated (i.e., they have more length than width). In the illustrated embodiments, signal pads 104 may be generally rectangular or generally oval in shape. As shown in FIG. 1, each signal pad has a hole or "signal via" 108 therein. In some embodiments, the diameter of the signal via is less than about 0.018 or less inches. Each signal via 108 extends through its respective signal pad 104 and through one or more other layers of circuit board 100. Each signal via 108 is electrically plated and functions to electrically connect its respective signal pad 104 to a transmission line (e.g., a trace) located within circuit board 100 (this is illustrated in FIG. 2, which is a cross sectional view of circuit board 100 along line 1—1 of FIG. 1).

Figure 2:
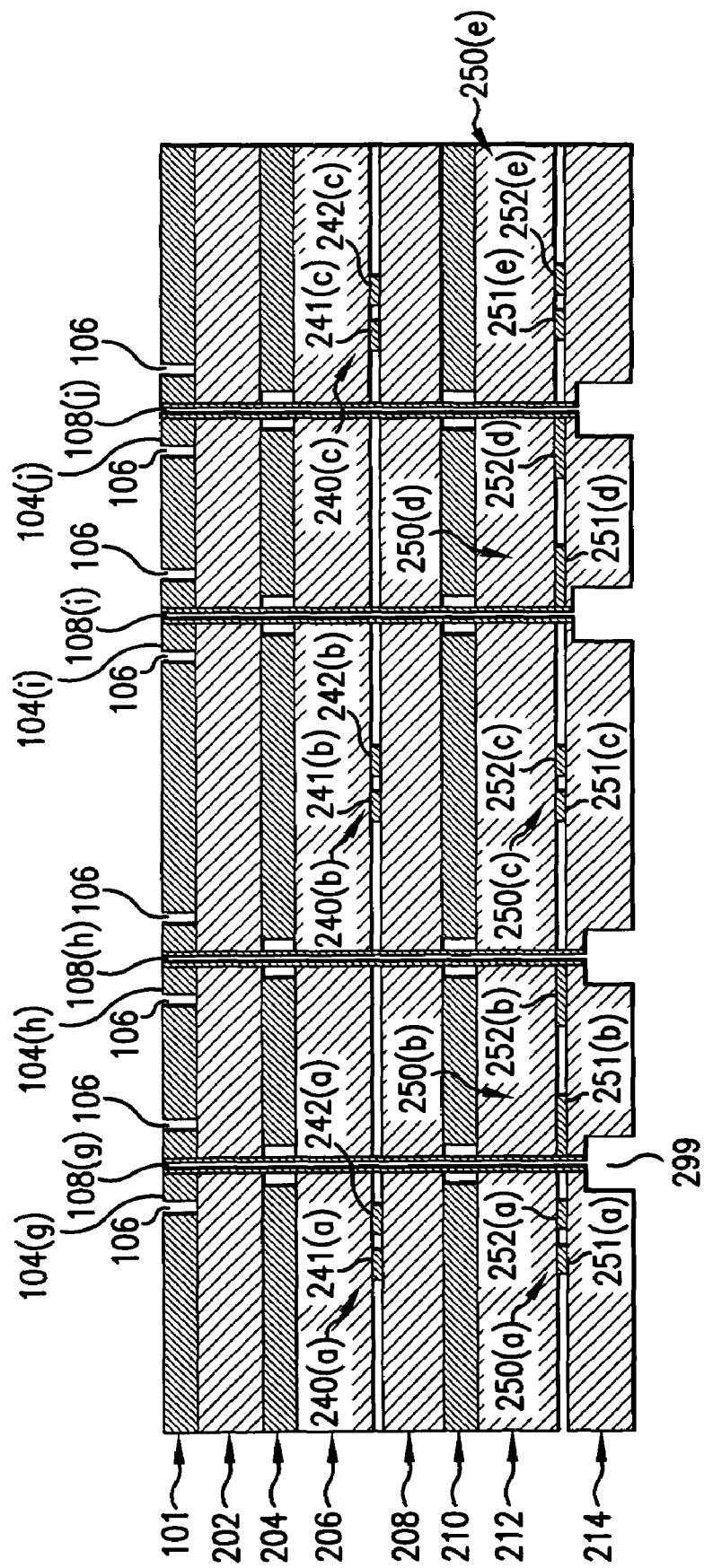
FIG. 2 is a cross sectional view of circuit board 100 along line 1—1 of FIG. 1.

As shown in FIG. 2, circuit board 100 is multilayered. The top layer 101 includes ground plane 102 and signal pads 104. The next layer down, layer 202, is a dielectric layer. Ground plane 102 and signal pads 104 may be placed onto dielectric layer 202 using conventional techniques. Underneath layer 202 is a ground plane 204 (i.e., a layer of electrically conducting material). Underneath ground plane 204 is dielectric layer 206 and underneath dielectric layer 206 is dielectric layer 208. A number of differential signal paths 240(*a*)–(*c*) are positioned on dielectric layer 208. Each differential signal path 240 includes a first transmission line 241 and a second transmission line 242. Underneath layer 208 is a ground plane 210. Underneath ground plane 210 is dielectric layer 212 and underneath dielectric layer 206 is a dielectric layer 214. A number of differential signal paths 250(*a*)–(*e*) are positioned on dielectric layer 214. Each differential signal path 250 includes a first transmission line 251 and a second transmission line 252. Circuit board 100 may have more or less layers than that shown in FIG. 2.

As shown in FIG. 2, signal via 108(*g*) electrically connects signal pad 104(*g*) with transmission line 251(*b*) and signal via 108(*h*) electrically connects signal pad 104(*h*) with transmission line 252(*b*). Similarly, signal via 108(*i*) electrically connects signal pad 104(*i*) with transmission line 251(*d*) and signal via 108(*j*) electrically connects signal pad 104(*j*) with transmission line 252(*d*). As also shown in FIG. 2, the signal vias 108 need extend only to a routing layer. The excess via stub can be removed by, e.g., backdrilling. For example, hole 299 was created by backdrilling to shorten the length of signal via 180(*g*).

Figure 3:
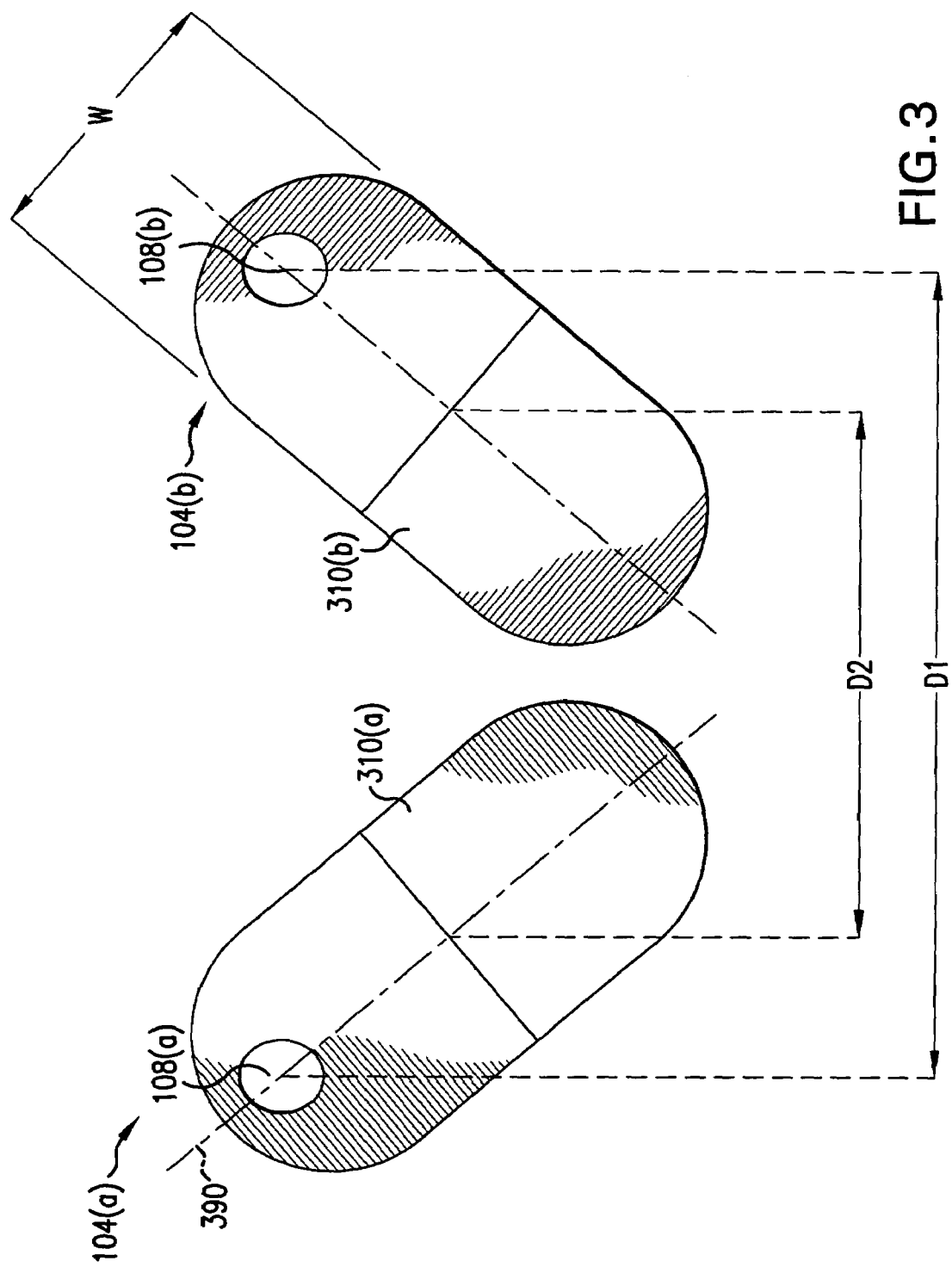
FIG. 3 illustrates a representative signal pad pair.
Figure 9:
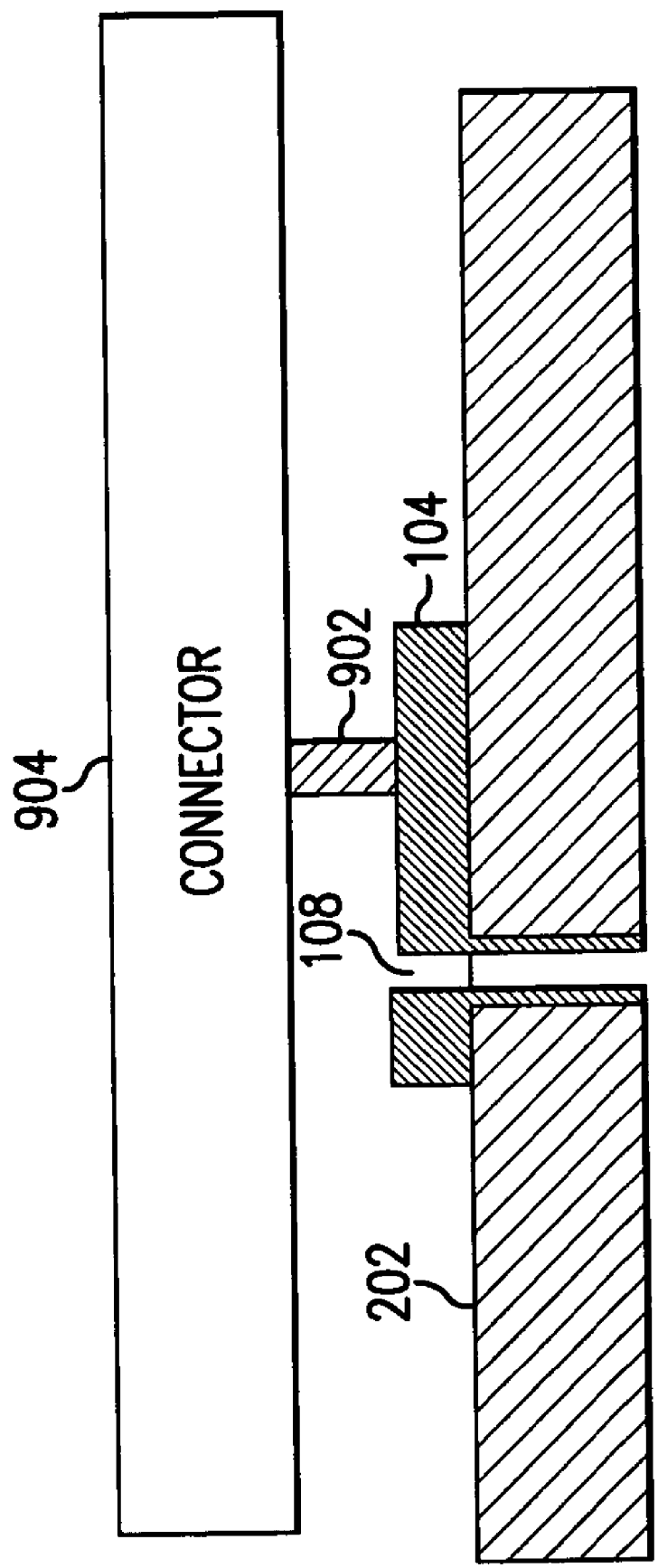
FIG. 9 illustrates how the contact section of a signal pad receives a contact element of a connector.

Referring to FIG. 3, FIG. 3 illustrates a representative signal pad pair (e.g., signal pads 104*a* and 104*b*). As discussed above, each signal pad 104 has a signal via 108 therein. Additionally, each signal pad 104 has a contact section 310, the center of which is spaced apart from the center of the signal via 108. The contact section 310 of a signal pad 104 is the portion of the signal pad 104 that receives a contact element 902 (see FIG. 9) of a connector 904. That is, the contact section 310 of a pad 104 is that portion of the pad 104 to which contact element 902 makes physical contact and presses against. Preferably, each signal via 108 is located more towards an end of its respective signal pad 104 than the middle of the pad, as shown in FIG. 3, to increase the area of the contact section 310. Also, preferably, the signal vias 108 are positioned in a signal pad such that the longitudinal axis 390 of the pad bisects or substantially bisects the via 108.

As further shown in FIG. 3, in one embodiment, the signal pads 104 that make up a signal pad pair are not parallel with respect to each other. Rather, in one embodiment, they form the general shape of a V. For example, the signal pads 104(*a*) and 104(*b*), which form a signal pad pair, are positioned so that the distance between the signal via 108(*a*), which is positioned at an end of pad 104(*a*), and the signal via 108(*b*), which is positioned at an end of signal pad 104(*b*), is greater than distance between the center of the pad 104(*a*) and the center of pad 104(*b*). This is illustrated in FIG. 3, which shows that the distance D1 is greater than the distance D2, where D1 is the distance between signal via 108(*a*) and 108(*b*) and where D2 is the distance between the center of pad 104(*a*) and the center of pad 104(*b*). In some embodiments, D1 is equal to about 0.080 inches and D2 is about 0.056 inches. Further, in some embodiments the width (W) of a signal pad 104 is about 0.030 inches.

Figure 4:
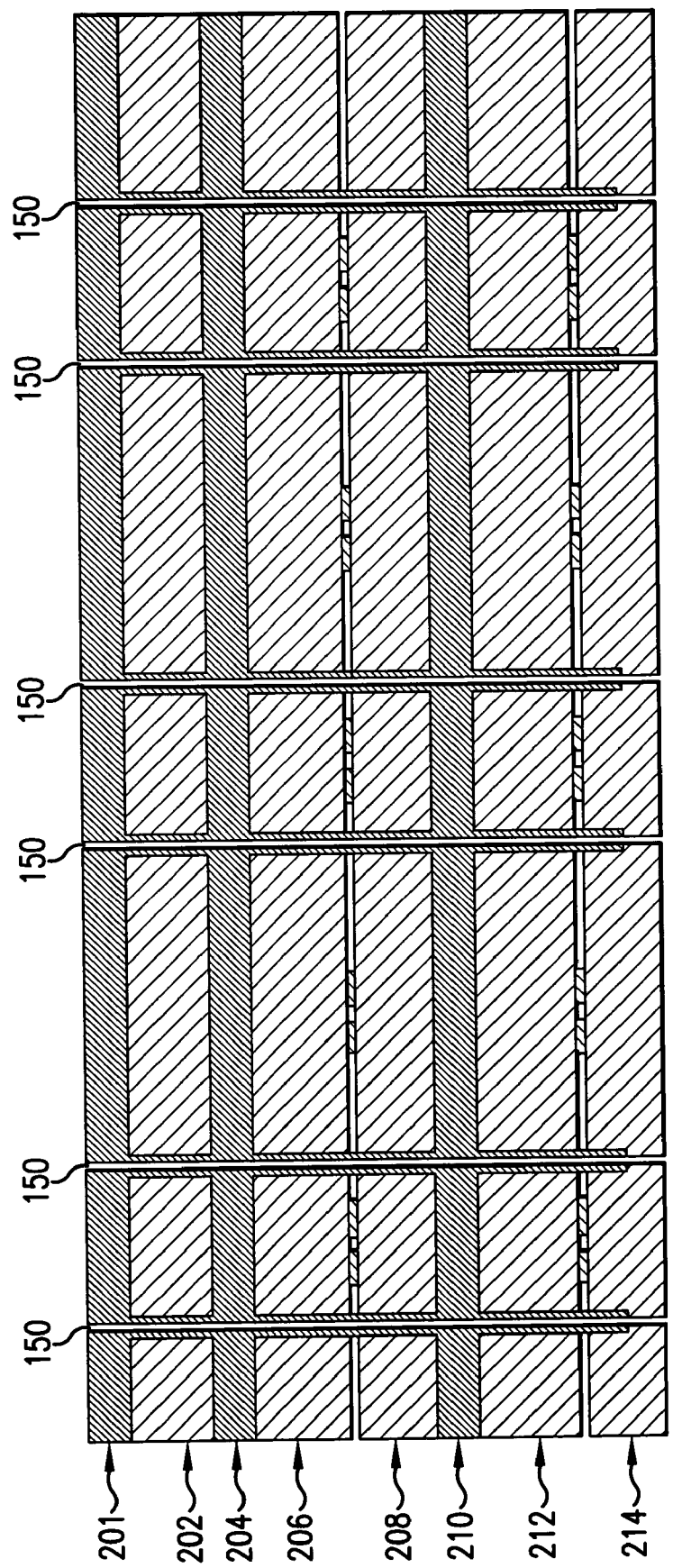
FIG. 4 is a cross sectional view of circuit board 100 along line 2—2 of FIG. 1.

Referring back to FIG. 1, in addition to each signal pad 104 having a via 108 for electrically connecting the signal pad 104 to a transmission line within circuit board 100, circuit board 100 has a set of vias 150 that electrically connect ground plane 102 to one or more ground planes within circuit board 100. Vias 150 are referred to as isolvias 150. Isolvias 150 are illustrated in FIG. 4, which is a cross sectional view of circuit board 100 along line 2—2 (see FIG. 1). As shown in FIG. 4, isolvias 150 electrically connect ground plane 102 to ground planes 204 and 210.

Figure 5:
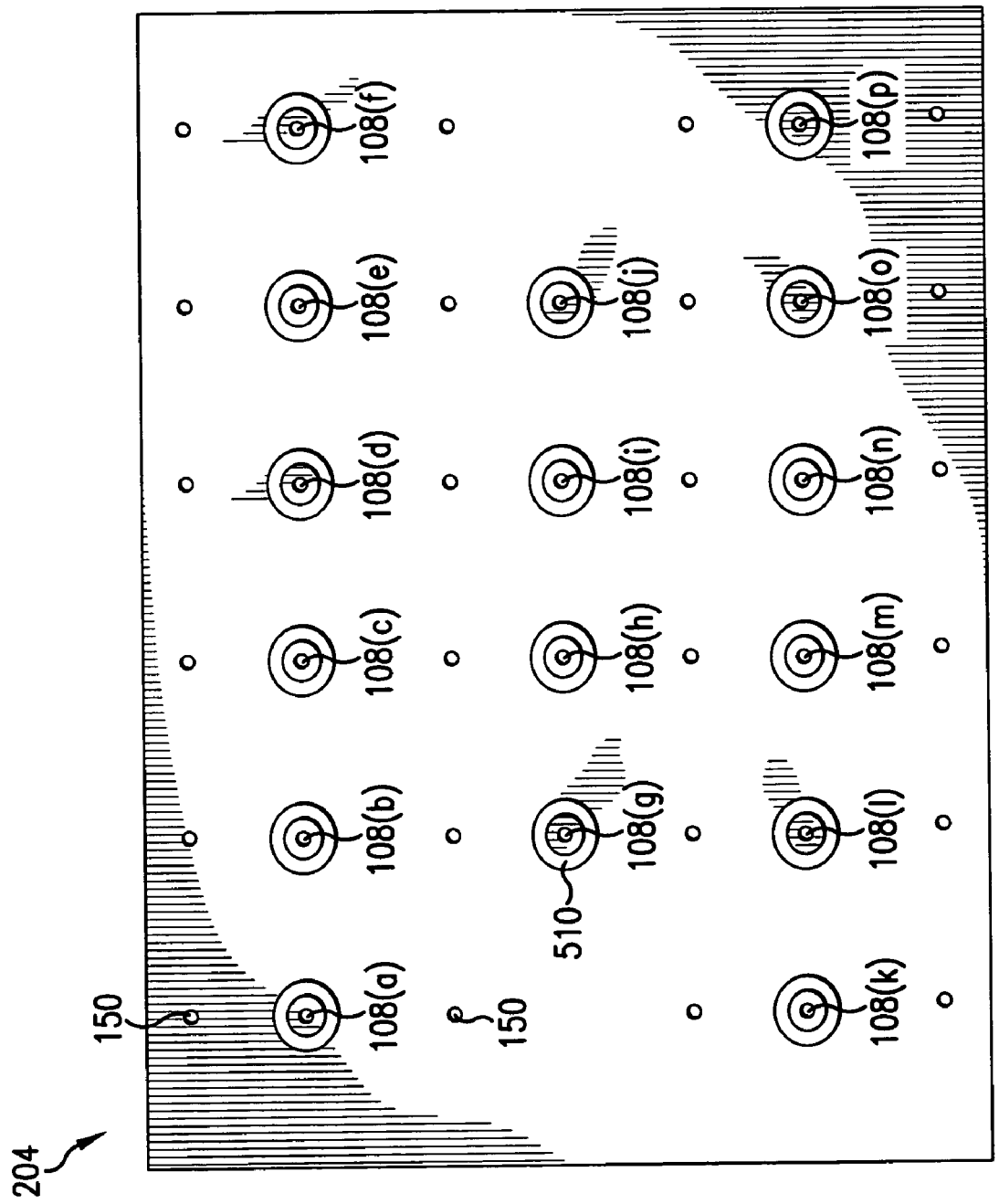
FIG. 5 shows a top view of ground plane 204 according to an embodiment of the present invention.

Referring now to FIG. 5, FIG. 5 shows a top view of ground plane 204. As shown in FIG. 5, isolvias 150 and signal vias 108 pass through ground plane 204. As also shown in FIG. 5, each signal via 108 is electrically isolated from ground plane 204 by an anti-pad 510. In some embodiments the diameter of each anit-pad 510 is about 0.053 inches.

FIG. 5 shows how the isolvias 150 and signal vias 108 are arranged in a column and row pattern. For example, as shown in FIG. 5, signal vias 108(*a*)–(*f*) are aligned in a first row; signal vias 108(*g*)–(*j*) are aligned in a second row; and signal vias 108(*k*)–(*p*) are aligned in a third row. The second row is between the first row and third row. As shown in FIG. 5, there are four rows of isolvias 150. Between each row of isolvias 150 there is a row of signal vias 108.

The rows of signal vias 108 are arranged such that: signal vias 108(*a*) and 108(*k*) are aligned in a first column; signal vias 108(*b*), 108(*g*) and 108(*l*) are aligned in a second column; signal vias 108(*c*), 108(*h*), and 108(*m*) are aligned in a third column; signal vias 108(*d*), 108(*i*), and 108(*n*) are aligned in a fourth column; signal vias 108(*e*), 108(*j*), and 108(*o*) are aligned in a fifth column; and signal vias 108(*f*) and 108(*p*) are aligned in a sixth column.

Figure 6:
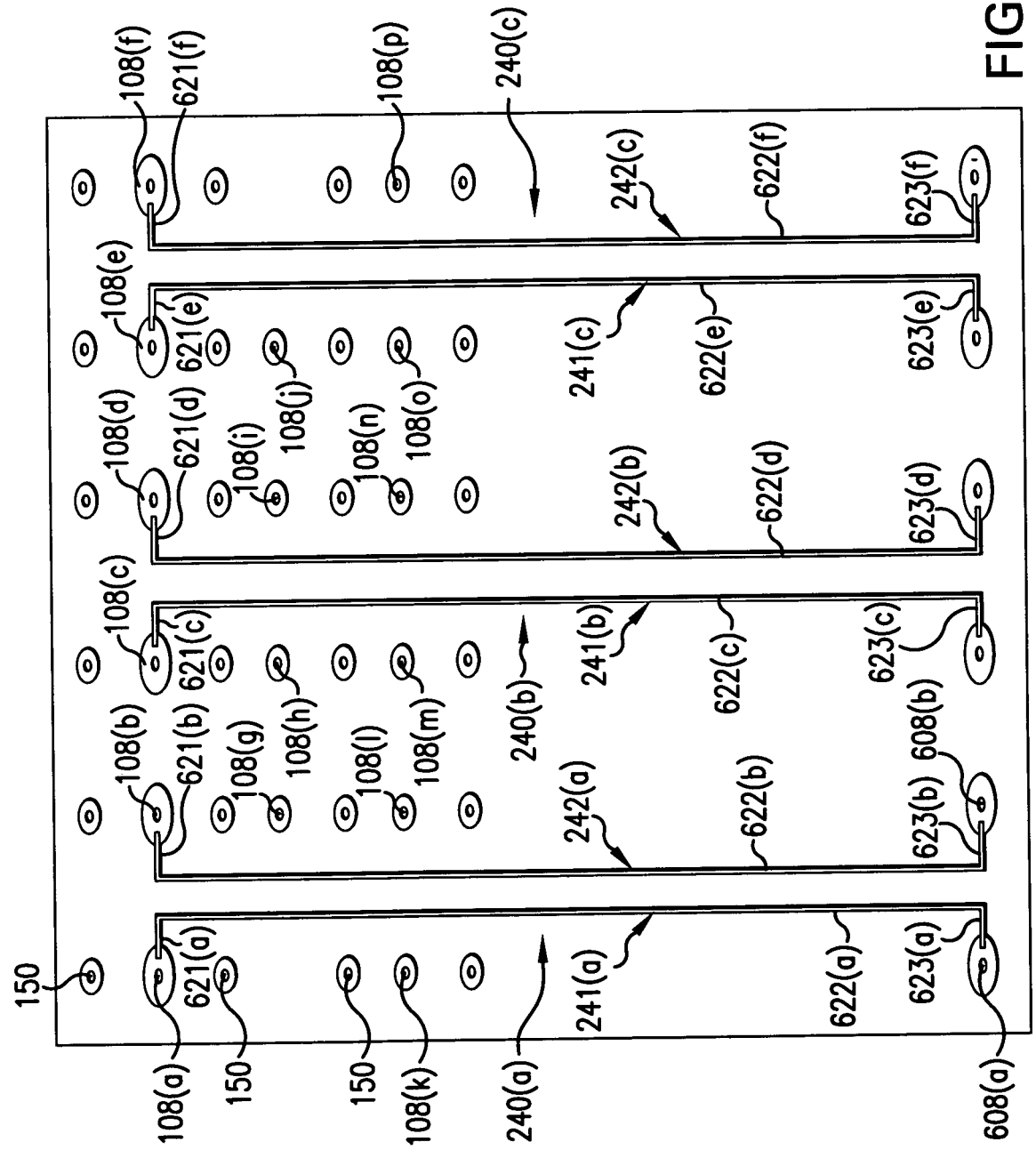
FIG. 6 shows a top view of layer 208 and differential transmission paths 240(a)–(c) according to an embodiment of the present invention.

Referring now to FIG. 6, FIG. 6 shows a top view of layer 208 and differential transmission paths 240(*a*)–(*c*). Each differential transmission path includes a pair of transmission lines 241 and 242. For example, differential transmission path 240(*a*) includes transmission line pair 241(*a*) and 242(*a*).

As shown in FIG. 6, signal vias 108 and isolvias 150 pass through layer 208. As further shown, some of the signal vias 108 are electrically connected to a transmission line of a differential signal path 240. More specifically, signal vias 108(*a*), 108(*c*), and 108(*e*) are electrically connected to transmission lines 241(*a*), (*b*) and (*c*), respectively, and signal vias 108(*b*), 108(*d*), and 108(*f*) are electrically connected to transmission lines 242(*a*), (*b*) and (*c*), respectively. Thus, signal vias 108(*a*)–(*f*) electrically connect signal contact pads 104(*a*)–(*f*) to a transmission line of a differential pair 240.

Preferably, as shown in FIG. 6, each transmission line 241, 242 has three sections: a first end section 621, a second end section 623, and an interim section 622 between the first end section 621 and the second end 623. In the embodiment shown, the interim section 622 of each transmission line 241,242 is straight and they are all parallel with each other. Additionally, the interim sections 622 are substantially longer than the end sections 621,623.

Also, in the embodiment shown, the first end section 621 of a given transmission line 241,242 is connected to a first signal via 108 and the second end section 623 of the given transmission line 241,242 is connected to a second signal via. In this manner, the two signal vias are electrically connected. For example, first end section 621(*a*) of transmission line 241(*a*) is physically connected to signal via 108(*a*) and second end section 623 of transmission line 241(*a*) is physically connected to signal via 608(*a*). Hence signal via 108(*a*) is electrically connected to signal via 608(*a*). Although not shown, signal vias 608, like signal vias 108, are electrically connected to a signal pad 104.

In one embodiment, for each transmission line 241 and 242, neither the first nor second end sections 621 and 623 are aligned with interim section 622. Instead, the end sections 621,623 are angled with respect to the interim section 622. In the embodiment shown in FIG. 6, the end sections 621,623 are angled at or about 90 degrees with respect to the interim section (i.e., they are perpendicular to the interim section). However, other angles are contemplated.

As discussed above and further illustrated in FIG. 6, each differential transmission path 240 electrically connects a first pair of signal vias to a second pair of signal vias. For example, differential transmission path 240(*a*) electrically connects a first pair of signal vias (signal vias 108(*a*) and 108(*b*)) to a second pair of signal signal (vias 608(*a*) and 608(*b*)). More specifically, transmission line 241(*a*) electrically connects signal via 108(*a*) to signal via 608(*a*) and transmission line 241(*b*) electrically connects signal via 108(*b*) to signal via 608(*b*).

Preferably, the distance between the signal vias that make up a pair is greater than the distance between the interim sections of the transmission lines connected to the signal vias. This feature is illustrated in FIG. 6. As shown in FIG. 6, for example, the distance between signal vias 108(*a*) and 108(*b*) is greater than the distance between the interim section of transmission line 241(*a*) and the interim section of transmission line 242(*a*). In some embodiments, the distance between signal vias of a pair is generally 0.080 inches and the distance between the interim sections of the transmission lines connected to the vias is generally 0.010 inches. In some embodiments, it is also preferred that the distance between a pair of signal vias connected by a transmission line of a differential path is equal or about equal to the length of the interim section of the transmission line. For example, as shown in FIG. 6, the distance between signal via 108(*a*) and signal via 608(*a*) is equal to or about equal to the length of the interim section of transmission line 241(*a*).

As further shown in FIG. 6, differential transmission path 240(*a*) runs between signal via 108(*k*) and 108(*l*). Similarly, differential transmission path 240(*b*) runs between signal via 108(*m*) and 108(*n*), and differential transmission path 240(*c*) runs between signal via 108(*o*) and 108(*p*).

Figure 7:
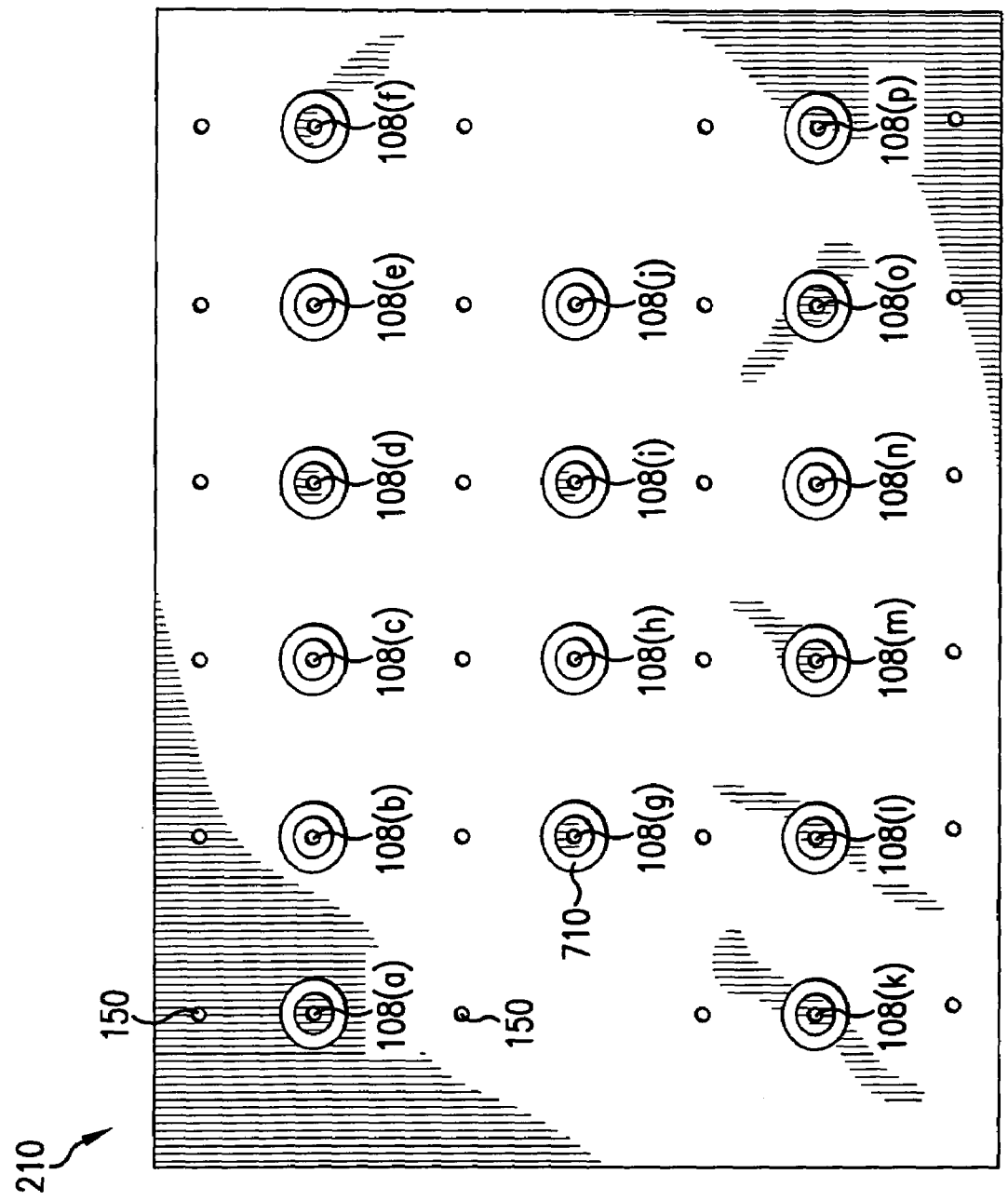
FIG. 7 shows a top view of ground plane 210 according to an embodiment of the present invention.

Referring now to FIG. 7, FIG.7 shows a top view of ground plane 210. As shown in FIG. 7, isolvias 150 and signal vias 108 pass through ground plane 204. As also shown in FIG. 7, each signal via 108 is electrically isolated from ground plane 204 by an anti-pad 710. In the embodiment shown, ground plane 210 is nearly identical to ground plane 204 (see FIG. 5). In some embodiments, the size of anti-pads 710 (e.g., the diameter of anit-pad 710 in the case of circular anit-pads) is less than the size of anti-pads 510. This is to reduce the inductive element of long vias.

Figure 8:
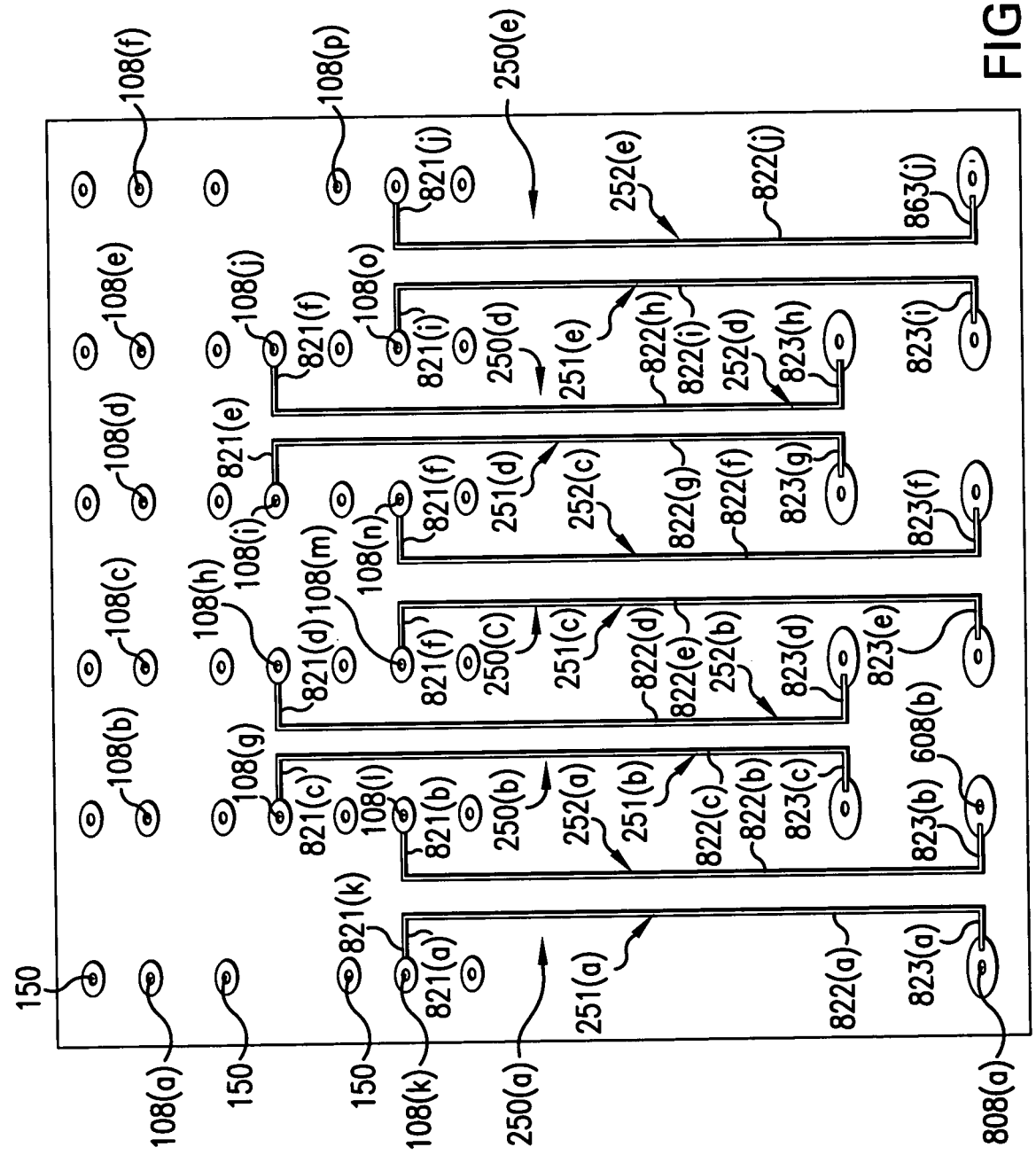
FIG. 8 shows a top view of layer 210 and differential transmission paths 250(a)–(e) according to an embodiment of the present invention.

Referring now to FIG. 8, FIG. 8 shows a top view of layer 214 and differential transmission paths 250(*a*)–(*e*). Each differential transmission path 250 includes a pair of transmission lines 251 and 252. For example, differential transmission path 250(*a*) includes transmission line pair 251(*a*) and 252(*a*).

As shown in FIG. 8, signal vias 108 and isolvias 150 may pass through layer 208. As further shown, some of the signal vias 108 are electrically connected to a transmission line of a differential signal path 250. More specifically, signal vias 108(*k*), 108(*g*), 108(*m*), 108(*i*), and 108(*o*) are electrically connected to transmission lines 251(*a*)–(*d*), respectively, and signal vias 108(*l*), 108(*h*), 108(*n*), 108(*j*), and 108(*p*) are electrically connected to transmission lines 252(*a*)–(*d*), respectively. Thus, signal vias 108(*g*)–(*p*) electrically connect signal contact pads 104(*g*)–(*p*) to a transmission line of a differential pair 250.

Like each transmission line 240, each transmission line 250 has three sections: a first end section 821, a second end section 823, and an interim section 822 connected between the first end section 812 and the second end 823. In the embodiment shown, the interim section 822 of each transmission line 251,252 is straight and they are all parallel with each other. Additionally, the interim sections 822 are substantially longer than the end sections 821,823.

In the embodiment shown, the first end section 821 of a given transmission line 251,252 is connected to a first signal via 108 and the second end section 823 of the given transmission line 251,252 is connected to a second signal via. In this manner, the two signal vias are electrically connected. For example, first end section 821(*a*) of transmission line 251(*a*) is physically connected to signal via 108(*k*) and second end section 823(*a*) of transmission line 251(*a*) is physically connected to signal via 808(*a*). Hence signal via 108(*k*) is electrically connected to signal via 608(*a*). Although not shown, signal vias 808, like signal vias 108, are electrically connected to a signal pad 104.

In one embodiment, for each transmission line 251 and 252, neither the first nor second end sections 821 and 823 are aligned with interim section 822. Instead, the end sections 821,823 are angled with respect to the interim section 822. In the embodiment shown in FIG. 8, the end sections 821,823 are angled at or about 90 degrees with respect to the interim section (i.e., they are perpendicular to the interim section). However, other angles are contemplated.

As discussed above and further illustrated in FIG. 8, each differential transmission path 250 electrically connects a first pair of signal vias to a second pair of signal vias. For example, differential transmission path 250(a) electrically connects a first pair of signal vias (signal vias 108(k) and 108(l)) to a second pair of signal signal (vias 808(a) and 808(b)). More specifically, transmission line 251(a) electrically connects signal via 108(k) to signal via 808(a) and transmission line 251(b) electrically connects signal via 108(l) to signal via 808(b).

Preferably, the distance between the signal vias that make up a pair is greater than the distance between the interim sections of the transmission lines connected to the signal vias. This feature was discussed above with respect to FIG. 6 and is further illustrated in FIG. 8. As shown in FIG. 8, for example, the distance between signal vias 108(k) and 108(l) is greater than the distance between the interim section of transmission line 251(a) and the interim section of transmission line 252(b). As further shown in FIG. 8, differential transmission path 250(b) runs between signal via 108(l), which is paired with via 108(k), and via 108(m), which is paired with via 108(n). Similarly, differential transmission path 250(d) runs between signal via 108(n), which is paired with via 108(m), and via 108(o), which is paired with via 108(p).

While various embodiments/variations of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A circuit board, comprising:
   a substantially V-shaped differential signal pad pair having a first signal pad and a second signal pad; and
   a ground plane surrounding, but electrically isolated from, the first signal pad and the second signal pad, wherein
   the first signal pad has (i) a signal via extending therethrough for electrically connecting the first signal pad to a first transmission line of a differential signal path located within the circuit board and (ii) a contact section for receiving a first contact element of a connector, the signal via being positioned near an end of the first signal pad;
   the second signal pad has (i) a signal via extending therethrough for electrically connecting the second signal pad to a second transmission line of the differential signal path and (ii) a contact section for receiving a second contact element of the connector, the signal via being positioned near an end of the second signal pad; and
   the distance between the signal via in the first signal pad and the signal via in the second signal pad is greater than the distance between the contact section of the first signal pad and contact section of the second signal pad.

2. The circuit board of claim 1, wherein the first and second signal pads are elongate.

3. The circuit board of claim 2, wherein the first and second signal pads are generally rectangular in shape.

4. The circuit board of claim 1, wherein the sides of both the first and second signal pads are surrounded by a dielectric, wherein the dielectric surrounding the sides of the first signal pad separates the first signal pad from the ground plane and the dielectric surrounding the sides of the second signal pad separates the second signal pad from the ground plane.

5. The circuit board of claim 4, wherein the dielectric is air.

6. The circuit board of claim 1, wherein the first and second signal pads are generally oval in shape.

7. The circuit board of claim 6, wherein the first signal pad and the second signal pad are both plated with nickel and/or gold.

8. The circuit board of claim 1, wherein the ground plane comprises copper.

9. The circuit board of claim 1, further comprising a plurality of ground vias extending through the ground plane, including a first and second ground via, wherein the first ground via is located near a first end of the first signal pad, and the second ground via is located near a second end of the first signal pad, the second end being opposite the first end.

10. The circuit board of claim 9, wherein the plurality of ground vias further includes a third and a fourth ground via, wherein the third ground via is located near a first end of the second signal pad, and the fourth ground via is located near a second end of the second signal pad, the second end being opposite the first end.

11. The circuit board of claim 10, wherein the first ground via, the second ground via, and the signal via of the first signal pad are arranged in first straight line and the third ground via, the fourth ground via, and the signal via of the second signal pad are arranged in a second straight line parallel with the first straight line.

12. The circuit board of claim 1, further comprising:
   a second differential signal pad pair consisting of a first signal pad and a second signal pad, the ground plane surrounding but electrically isolated from, the first and second signal pad of the second differential signal pad pair, wherein
   the first signal pad of the second differential pad pair has (i) a signal via extending therethrough and electrically connecting the first signal pad to a first transmission line of a second differential signal path located within the circuit board and (ii) a contact section for receiving a third contact element of the connector, the signal via being positioned near an end of the first signal pad and spaced apart from the center of the pad;
   the second signal pad of the second differential pad pair has (i) a signal via extending therethrough and electrically connecting the second signal pad to a second transmission line of the second differential signal path and (ii) a contact section for receiving a fourth contact element of the connector, the signal via being positioned near an end of the second signal pad and spaced apart from the center of the pad; and
   the distance between the center of the signal via in the first signal pad and the center of the signal via in the second signal pad is greater than the distance between the center of the contact portion of the of the first signal pad and the center of the contact portion of the second signal pad.

13. The circuit board of claim 12, wherein all of said signal vias are arranged in a straight line.

14. The circuit board of claim 13, wherein
   the signal via of the second signal pad of the first signal pad pair is between the signal via of the first signal pad of the first signal pad pair and the signal via of the first signal pad of the second signal pad pair; and
   the signal via of the first signal pad of the second signal pad pair is between the signal via of the second signal pad of the first signal pad pair and the signal via of the second signal pad of the second signal pad pair.

15. The circuit board of claim 1, wherein a portion of the ground plane is disposed directly between the first signal pad and the second signal pad.

16. The circuit board of claim 1, further comprising:

a second differential signal pad pair consisting of a first signal pad and a second signal pad, the ground plane surrounding both the first and second signal pads of the second differential signal pad pair, wherein (A) the first signal pad of the second differential pad pair has (i) a signal via extending therethrough and electrically connecting the first signal pad to a first transmission line of a second differential signal path located within the circuit board and (ii) a contact section for receiving a third contact element of the connector, the signal via being positioned near an end of the first signal pad and spaced apart from the center of the pad; (B) the second signal pad of the second differential pad pair has (i) a signal via extending therethrough and electrically connecting the second signal pad to a second transmission line of the second differential signal path and (ii) a contact section for receiving a fourth contact element of the connector, the signal via being positioned near an end of the second signal pad and spaced apart from the center of the pad; and (C) the distance between the center of the signal via in the first signal pad and the center of the signal via in the second signal pad is greater than the distance between the center of the contact portion of the of the first signal pad and the center of the contact portion of the second signal pad;

a third differential signal pad pair consisting of a first signal pad and a second signal pad, the ground plane surrounding both the first and second signal pads of the third differential signal pad pair, wherein (A) the first signal pad of the third differential pad pair has (i) a signal via extending therethrough and electrically connecting the first signal pad to a first transmission line of a third differential signal path located within the circuit board and (ii) a contact section for receiving a fifth contact element of the connector, the signal via being positioned near an end of the first signal pad and spaced apart from the center of the pad; (B) the second signal pad of the third differential pad pair has (i) a signal via extending therethrough and electrically connecting the second signal pad to a second transmission line of the third differential signal path and (ii) a contact section for receiving a sixth contact element of the connector, the signal via being positioned near an end of the second signal pad and spaced apart from the center of the pad; and (C) the distance between the center of the signal via in the first signal pad and the center of the signal via in the second signal pad is greater than the distance between the center of the contact portion of the of the first signal pad and the center of the contact portion of the second signal pad;

a fourth differential signal pad pair consisting of a first signal pad and a second signal pad, the ground plane surrounding both the first and second signal pads of the fourth differential signal pad pair, wherein (A) the first signal pad of the fourth differential pad pair has (i) a signal via extending therethrough and electrically connecting the first signal pad to a first transmission line of a fourth differential signal path located within the circuit board and (ii) a contact section for receiving a seventh contact element of the connector, the signal via being positioned near an end of the first signal pad and spaced apart from the center of the pad; (B) the second signal pad of the fourth differential pad pair has (i) a signal via extending therethrough and electrically connecting the second signal pad to a second transmission line of the fourth differential signal path and (ii) a contact section for receiving an eighth contact element of the connector, the signal via being positioned near an end of the second signal pad and spaced apart from the center of the pad; and (C) the distance between the center of the signal via in the first signal pad and the center of the signal via in the second signal pad is greater than the distance between the center of the contact portion of the of the first signal pad and the center of the contact portion of the second signal pad; and a fifth differential signal pad pair consisting of a first signal pad and a second signal pad, the ground plane surrounding both the first and second signal pads of the fifth differential signal pad pair, wherein (A) the first signal pad of the fifth differential pad pair has (i) a signal via extending therethrough and electrically connecting the first signal pad to a first transmission line of a fifth differential signal path located within the circuit board and (ii) a contact section for receiving a ninth contact element of the connector, the signal via being positioned near an end of the first signal pad and spaced apart from the center of the pad; (B) the second signal pad of the fifth differential pad pair has (i) a signal via extending therethrough and electrically connecting the second signal pad to a second transmission line of the fifth differential signal path and (ii) a contact section for receiving a tenth contact element of the connector, the signal via being positioned near an end of the second signal pad and spaced apart from the center of the pad; and (C) the distance between the center of the signal via in the first signal pad and the center of the signal via in the second signal pad is greater than the distance between the center of the contact portion of the of the first signal pad and the center of the contact portion of the second signal pad, wherein the signal vias of the first differential signal pad pair are aligned with the signal vias of the second differential signal pad pair along a first line, the signal vias of the fourth differential signal pad pair are aligned with the signal vias of the fifth differential signal pad pair along a second line, the second line being parallel with the first line, the signal via of the second signal pad of the first differential signal pad pair, and the signal via of the first signal pad of the fourth differential signal pad pair, aligned on a third line, the third line being perpendicular with the first line, the signal via of the first signal pad of the second differential signal pad pair, and the signal via of the second signal pad of the fourth differential signal pad pair, are all aligned on a fourth line, the fourth line being perpendicular with the first line the signal via of the second signal pad of the second differential pad pair and the signal via of the first signal pad of the fifth differential signal pad pair are aligned on a fifth line, the fifth line being perpendicular with the first line, and the signal via of the first signal pad of the third differential pad pair and the signal via of the second signal pad of the fifth differential signal pad pair are aligned on a sixth line, the sixth line being perpendicular with the first line.

17. A circuit board, comprising:

a substantially v-shaped differential signal pad pair comprising a first signal pad and a second signal pad, wherein:

the first and second signal pads are elongate and substantially oval or rectangular in shape;
a longitudinal axis of the first signal pad is not parallel with a longitudinal axis of the first signal pad;
the first signal pad has a first signal via extending therethrough, the first signal via being positioned towards an end of the first signal pad;
the second signal pad has a second signal via extending therethrough, the second signal via being positioned towards an end of the second signal pad; and
the distance between the first signal via and the second is greater than the distance between the center of the first signal pad and the center of the second signal pad.

18. The circuit board of claim 17, further comprising a ground plane surrounding, but electrically isolated from, the first and second signal pad, wherein a portion of the ground plane is disposed directly between the first signal pad and the second signal pad.

19. The circuit board of claim 18, wherein the sides of both the first and second signal pads are surrounded by a dielectric, wherein the dielectric surrounding the sides of the first signal pad separates the first signal pad from the ground plane and the dielectric surrounding the sides of the second signal pad separates the second signal pad from the ground plane.

20. The circuit board of claim 19, wherein the dielectric is air.

21. The circuit board of claim 18, wherein the ground plane comprises copper.

22. The circuit board of claim 17, wherein the first signal pad and the second signal pad are both plated with nickel and/or gold.

23. The circuit board of claim 17, wherein the diameter of the first signal via and the diameter of the second signal via are both about 0.018 inches.

24. The circuit board of claim 17, wherein the distance between the first signal via and the second signal via is about 0.08 inches.

25. The circuit board of claim 24, wherein the distance between the center of the first signal pad and the center of the second signal pad is about 0.06 inches.

26. The circuit board of claim 17, further comprising:
a second differential signal pad pair consisting of a first signal pad and a second signal pad, wherein: the first and second signal pads are elongate and substantially oval or rectangular in shape; a longitudinal axis of the first signal pad is not parallel with a longitudinal axis of the second signal pad; the first signal pad has a first signal via extending therethrough, the first signal via being positioned towards an end of the first signal pad; the second signal pad has a second signal via extending therethrough, the second signal via being positioned towards an end of the second signal pad; and the distance between the first signal via and the second is greater than the distance between the center of the first signal pad and the center of the second signal pad;
a third differential signal pad pair consisting of a first signal pad and a second signal pad, wherein: the first and second signal pads are elongate and substantially oval or rectangular in shape; a longitudinal axis of the first signal pad is not parallel with a longitudinal axis of the second signal pad; the first signal pad has a first signal via extending therethrough, the first signal via being positioned towards an end of the first signal pad;
the second signal pad has a second signal via extending therethrough, the second signal via being positioned towards an end of the second signal pad; and the distance between the first signal via and the second is greater than the distance between the center of the first signal pad and the center of the second signal pad;
a fourth differential signal pad pair consisting of a first signal pad and a second signal pad, wherein: the first and second signal pads are elongate and substantially oval or rectangular in shape; a longitudinal axis of the first signal pad is not parallel with a longitudinal axis of the second signal pad; the first signal pad has a first signal via extending therethrough, the first signal via being positioned towards an end of the first signal pad; the second signal pad has a second signal via extending therethrough, the second signal via being positioned towards an end of the second signal pad; and the distance between the first signal via and the second is greater than the distance between the center of the first signal pad and the center of the second signal pad; and
a fifth differential signal pad pair consisting of a first signal pad and a second signal pad, wherein: the first and second signal pads are elongate and substantially oval or rectangular in shape; a longitudinal axis of the first signal pad is not parallel with a longitudinal axis of the second signal pad; the first signal pad has a first signal via extending therethrough, the first signal via being positioned towards an end of the first signal pad; the second signal pad has a second signal via extending therethrough, the second signal via being positioned towards an end of the second signal pad; and the distance between the first signal via and the second is greater than the distance between the center of the first signal pad and the center of the second signal pad, wherein
the signal vias of the first differential signal pad pair are aligned with the signal vias of the second differential signal pad pair along a first line,
the signal vias of the fourth differential signal pad pair are aligned with the signal vias of the fifth differential signal pad pair along a second line, the second line being parallel with the first line,
the signal via of the second signal pad of the first differential signal pad pair and the signal via of the first signal pad of the fourth differential signal pad pair are aligned on a third line, the third line being perpendicular with the first line,
the signal via of the first signal pad of the second differential signal pad pair and the signal via of the second signal pad of the fourth differential signal pad pair are aligned on a fourth line, the fourth line being perpendicular with the first line
the signal via of the second signal pad of the second differential pad pair and the signal via of the first signal pad of the fifth differential signal pad pair are aligned on a fifth line, the fifth line being perpendicular with the first line, and
the signal via of the first signal pad of the third differential pad pair and the signal via of the second signal pad of the fifth differential signal pad pair are aligned on a sixth line, the sixth line being perpendicular with the first line.

* * * * *